(12) United States Patent
Liou

(10) Patent No.: US 9,806,031 B2
(45) Date of Patent: Oct. 31, 2017

(54) MONITOR METHOD FOR PROCESS CONTROL IN A SEMICONDUCTOR FABRICATION PROCESS

(71) Applicant: UNITED MICROELECTRONICS CORP., Hsin-Chu (TW)

(72) Inventor: En-Chiuan Liou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 35 days.

(21) Appl. No.: 14/692,761

(22) Filed: Apr. 22, 2015

(65) Prior Publication Data

US 2016/0313648 A1 Oct. 27, 2016

(51) Int. Cl.
 *H01L 23/544* (2006.01)
 *H01L 21/66* (2006.01)
 *G03F 7/20* (2006.01)

(52) U.S. Cl.
 CPC ........ *H01L 23/544* (2013.01); *G03F 7/70633* (2013.01); *H01L 22/26* (2013.01)

(58) Field of Classification Search
 CPC . G03F 7/70141; H01L 23/544; H01L 21/324; H01L 22/26; H01L 21/02636; H01L 21/265; H01L 21/3083; H01L 2223/54426; H01L 2223/54453
 See application file for complete search history.

(56) References Cited

U.S. PATENT DOCUMENTS

| | | | | |
|---|---|---|---|---|
| 4,423,127 | A * | 12/1983 | Fujimura | G03F 9/7084 257/E21.211 |
| 5,580,831 | A * | 12/1996 | Roman | H01L 23/544 148/DIG. 28 |
| 5,716,889 | A * | 2/1998 | Tsuji | G03F 9/70 257/797 |
| 5,936,311 | A * | 8/1999 | Watrobski | H01L 23/528 257/48 |
| 5,952,694 | A * | 9/1999 | Miyawaki | H01L 21/2007 257/347 |
| 6,172,409 | B1 * | 1/2001 | Zhou | G03F 7/708 257/620 |
| 7,184,853 | B2 | 2/2007 | Roberts | |
| 8,111,376 | B2 | 2/2012 | Adel | |
| 2003/0143761 | A1 * | 7/2003 | Fukuda | H01L 23/544 438/7 |
| 2011/0084314 | A1 * | 4/2011 | Or-Bach | G03F 9/7076 257/209 |
| 2011/0228080 | A1 * | 9/2011 | Ding | H01L 21/67259 348/135 |
| 2013/0095580 | A1 * | 4/2013 | Or-Bach | H01L 23/481 438/17 |
| 2013/0279525 | A1 * | 10/2013 | Zheng | H04J 3/0667 370/516 |

* cited by examiner

*Primary Examiner* — Robert Fennema
*Assistant Examiner* — Marzia T Monty
(74) *Attorney, Agent, or Firm* — Winston Hsu

(57) ABSTRACT

A monitor method for process control in a semiconductor fabrication process is disclosed. A first alignment mark is formed in a layer on a substrate, and its position is measured and stored in a first measurement data. A fabrication process is then performed. Afterwards, another measurement is performed to measure the position of the first alignment mark and to generate a second measurement data. Finally, an offset value between the position of the first alignment mark in the first measurement data and those in the second measurement data is calculated.

8 Claims, 4 Drawing Sheets

MONITOR METHOD FOR PROCESS CONTROL IN A SEMICONDUCTOR FABRICATION PROCESS

BACKGROUND OF THE INVENTION

1. Field of the Invention

The present invention relates generally to a method of monitoring alignment marks on a substrate and, more particularly, to a method of monitoring alignment marks on a substrate during a semiconductor fabrication process.

2. Description of the Prior Art

Photolithography is a process commonly used in semiconductor fabrication for selectively removing portions of a thin film from or depositing portions of a film onto discrete areas of a surface of a semiconductor wafer. A typical photolithography process includes spin coating a layer of a light-sensitive material (commonly referred to as a "photoresist") onto the surface of the semiconductor wafer. The semiconductor wafer is then exposed to a pattern of light that chemically modifies a portion of the photoresist incident to the light. The process further includes removing one of the incident portion or the non-incident portion from the surface of the semiconductor wafer with a chemical solution (e.g., a "developer") to form a pattern of openings in the photoresist on the wafer. Subsequently, portions of the thin film on the surface of the semiconductor wafer can be selectively removed from or deposited onto the surface of the wafer through the openings of the photoresist mask. The photolithography process can be repeated to form layers of microelectronic features on or in the semiconductor wafer.

In the foregoing process, a new pattern must be aligned with patterns already on the semiconductor wafer before exposure. If the alignment of the new pattern is inaccurate, the new pattern may overlap and/or otherwise interfere with existing patterns on the semiconductor wafer to render the formed features inoperable. As a result, the alignment accuracy can directly impact product yields of the photolithography process. In addition, in order to accurately align the new pattern with the patterns already on the semiconductor wafer, several alignments marks on the semiconductor wafer are used during the alignment. The individual alignment marks can include a trench, a grating, a circle, a square, and/or other suitable pattern on the microelectronic wafer.

Moreover, the photolithography processes as well as other suitable fabrication processes such as an etch processes, a deposition process, an implantation process and so forth are carried out until final electronic devices are produced. During the fabrication processes, the stress in films deposited on the semiconductor wafer is often generated, which may cause the change in the topography of the semiconductor wafer and shifts in the position of the alignment marks. This drawback apparently affects the alignment accuracy of the photolithography process.

SUMMARY OF THE INVENTION

According to one embodiment of the present invention, a monitor method for process control in a semiconductor fabrication process is disclosed. A first alignment mark is formed in a layer on a substrate and its position is measured to generate a first measurement data. A fabrication process is then performed. Afterwards, another measurement is performed to measure the position of the first alignment mark and to generate a second measurement data. Finally, an offset value between the position of the first alignment mark in the first measurement data and those in the second measurement data is calculated.

These and other objectives of the present invention will no doubt become obvious to those of ordinary skill in the art after reading the following detailed description of the preferred embodiment that is illustrated in the various figures and drawings.

DETAILED DESCRIPTION

Various embodiments of photolithography systems for processing microelectronic substrates and associated alignment correction methods are described below. The term "microelectronic substrate" is used throughout to include substrates upon which and/or in which microelectronic devices, micromechanical devices, data storage elements, read/write components, and other features are fabricated. Such a microelectronic substrate can include one or more conductive and/or nonconductive layers (e.g., metallic layer, semiconductor layers, and/or dielectric layers) that are situated upon or within one another. These conductive and/or nonconductive layers can also include a wide variety of electrical elements, mechanical elements, and/or systems of such elements in the conductive and/or nonconductive layers (e.g., an integrated circuit, a memory, a processor, a microelectromechanical system (MEMS), an imager, etc.). The term "photoresist" generally refers to a material that can be chemically modified when exposed to electromagnetic radiation. The term encompasses both positive photoresist configured to be soluble when activated by the electromagnetic radiation and negative photoresist configured to be insoluble when activated by light. A person skilled in the relevant art will also understand that the disclosure may have additional embodiments, and that the disclosure may be practiced without several of the details of the embodiments described below with reference to FIGS. 1-7.

Figure 1:
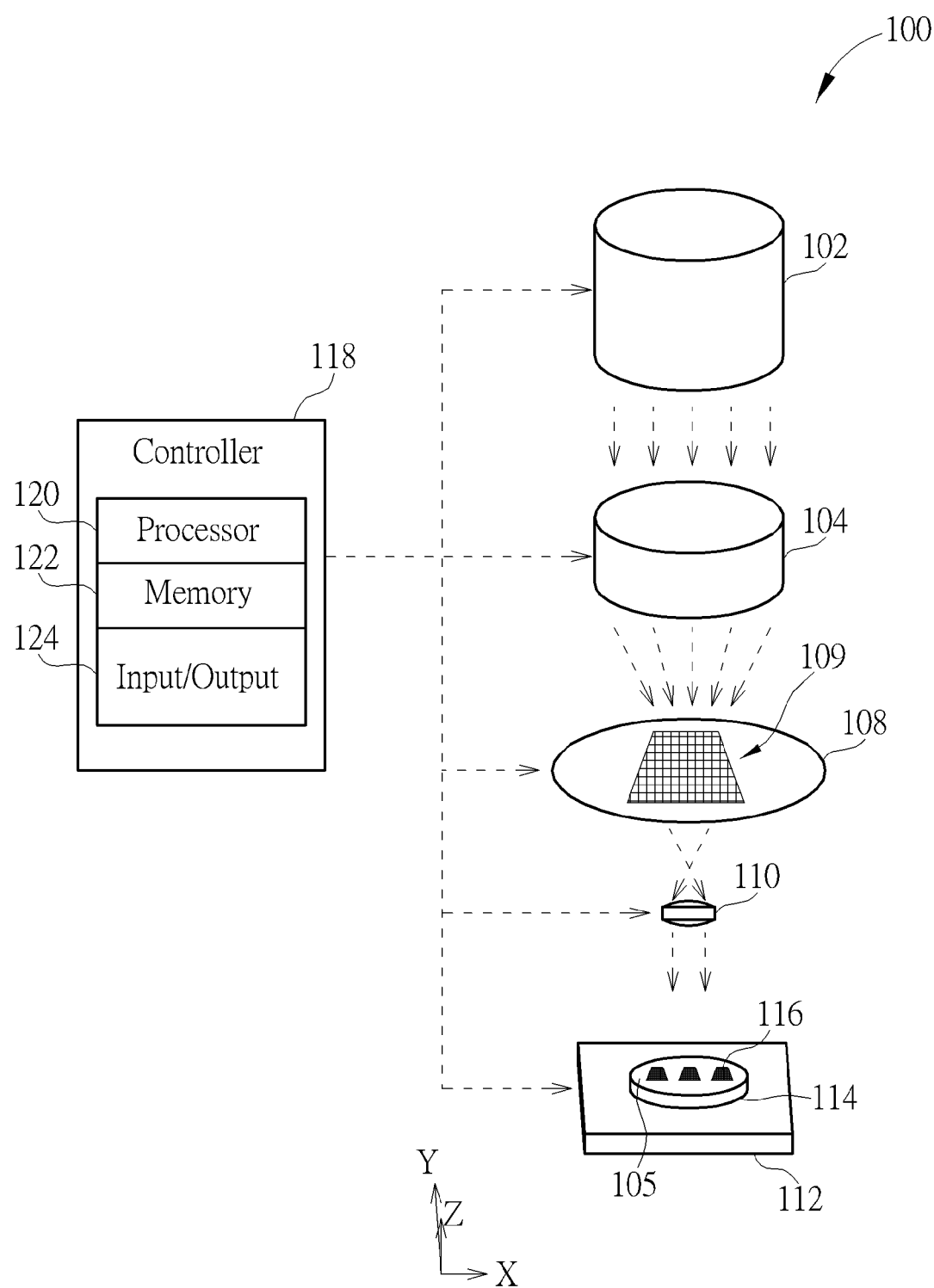
FIG. 1 is a schematic view of a photolithography system configured in accordance with an embodiment of the disclosure.

FIG. 1 is a schematic view of a photolithography system configured in accordance with an embodiment of the disclosure. In the embodiment illustrated in FIG. 1, the photolithography system 100 includes an illumination source 102, a condenser lens 104, a reticle 108, an objective lens 110, and a substrate support 112 arranged in series. A controller 118 is operatively coupled to the various components of the photolithography system 100 for monitoring and/or controlling the operation of these components. In other embodiments, the photolithography system 100 can also include a substrate transport station, a structural support (e.g., a reticle support, a lens support, etc.), position sensors (e.g., a scatterometer), an immersion hood, a support actuator (e.g., an electric motor), and/or other suitable mechanical and/or electrical components.

The illumination source 102 can include an ultraviolet light source (e.g., a fluorescent lamp), a laser source (e.g., an argon fluoride excimer laser), and/or other suitable electromagnetic emission sources. The illumination source 102 can also include lenses, collimators, mirrors, and/or other suitable conditioning components (not shown). In certain embodiments, the illumination source 102 can be configured to produce a generally coherent illumination at a single frequency. In other embodiments, the illumination source 102 can also be at least partially incoherent. In further embodiments, the illumination source 102 can also be configured to generate illumination at multiple frequencies.

The condenser lens 104 can be configured to concentrate the illumination from the illumination source 102 onto the reticle 108. In certain embodiments, the condenser lens 104 can include a plurality of reflective and/or refractive lenses arranged in series. In other embodiments, the condenser lens 104 can also include collimators, mirrors, and/or other suitable illumination conditioning components. The photolithography system can also include actuators (e.g., electric motors) configured to move the condenser lens 104 relative to the illumination source 102 and/or the reticle 108 based on instructions from the controller 118.

The reticle 108 can include an opaque plate with lines, apertures, and/or transparencies that allow the illumination from the illumination source 102 to pass through in a defined pattern 109. In the illustrated embodiment, the pattern 109 includes a grating. In other embodiments, the pattern 109 can also include a collection of lines, channels, apertures, shapes, and/or other geometric elements in a suitable arrangement. In further embodiments, the reticle 108 can also include layers of material with different refraction index values and/or other suitable phase-shifting components (not shown). As a result, the reticle 108 can achieve a desired phase shift (e.g., 180 .degree.) between illumination transmitted through the pattern 109 and illumination that is transmitted through another area of the reticle 108.

The objective lens 110 can be configured to project the illumination from the reticle 108 onto the photoresist 105 of a semiconductor substrate such as a microelectronic substrate 114. As shown in FIG. 1, the microelectronic substrate 114 can be divided into discrete areas (hereinafter referred to as "fields 116"). During exposure, the pattern 109 from the reticle 108 can be replicated or printed individually onto the photoresist 105 in one of the fields 116. Even though the fields 116 are shown in FIG. 1 as spaced apart from one another, in other embodiments, adjacent fields 116 can be abutting one another, as described in more detail below with reference to FIGS. 2 and 4, or the fields 116 can have other suitable arrangements relative to one another.

The substrate support 112 can be configured to carry the microelectronic substrate 114. The substrate support 112 can include a vacuum chuck, a mechanical chuck, and/or other suitable supporting devices. In the illustrated embodiment, the photolithography system 100 includes at least one actuator (not shown) configured to move the substrate support 112 laterally (as indicated by the X-axis), transversely (as indicated by the Y-axis), and/or vertically (as indicated by the Z-axis) relative to the reticle 108 and/or other components of the photolithography system 100. In certain embodiments, the substrate support 112 can also include a position transmitter configured to monitor the position of the substrate support 112 along the X-axis, Y-axis, and/or the Z-axis. Even though only one substrate support 112 is shown in FIG. 1, in certain embodiments, the photolithography system 100 can include two, three, or any desired number of substrate supports with structures and/or functions that are generally similar to or different than the substrate support 112.

The controller 118 can include a processor 120 coupled to a memory 122 and an input/output component 124. The processor 120 can include a microprocessor, a field-programmable gate array, and/or other suitable logic devices. The memory 122 can include volatile and/or nonvolatile media (e.g., ROM; RAM, magnetic disk storage media; optical storage media; flash memory devices, and/or other suitable storage media) and/or other types of computer-readable storage media configured to store data received from, as well as instructions for the processor 120. The input/output component 124 can include a display, a touch screen, a keyboard, a mouse, and/or other suitable types of input/output devices configured to accept input from and provide output to an operator.

In certain embodiments, the controller 118 can include a personal computer operatively coupled to the other components of the photolithography system 100 via a communication link (e.g., a USB link, an Ethernet link, a Bluetooth link, etc.). In other embodiments, the controller 118 can include a network server operatively coupled to the other components of the photolithography system 100 via a network connection (e.g., an internet connection, an intranet connection, etc.). In further embodiments, the controller 118 can include a process logic controller, a distributed control system, and/or other suitable computing frameworks.

In operation, the photolithography system 100 can first receive a batch of microelectronic substrates 114 in a substrate transport station (not shown) and/or other suitable substrate holding device. The batch can include any desired number of microelectronic substrates 114. The microelectronic substrate 114 is loaded onto the substrate support 112. The individual fields 116 of the microelectronic substrate 114 can then be aligned with the pattern 109 before exposure to the illumination source 102.

In certain embodiments, the photolithography system 100 can expose the individual fields 116 of the microelectronic substrate 114 in a step mode. For example, the controller 118 can energize the actuator(s) to move the substrate support 112 a discrete distance (commonly referred to as a "step") along the X-axis or the Y-axis. Once the field 116 is in position, the illumination source 102 illuminates the incident field 116 through the reticle 108 for a preselected period of time. The illumination is then turned off, and the controller 118 energizes the actuator(s) to move the substrate support 112 another step along either the X-axis or the Y-axis. A subsequent field 116 is exposed in a similar fashion, and this process is repeated until all of the fields 116 are exposed.

In other embodiments, the controller 118 can operate the photolithography system 100 in a scanning mode. For example, the controller 118 can control the actuators to move the substrate support 112 continuously along the X-axis or the Y-axis at a preselected speed in a first direction or a second direction opposite the first direction. As the fields 116 move along the X-axis or the Y-axis, the illumination source 102 illuminates the photoresist 105 on the microelectronic substrate 114 to print a copy of the pattern 109 in the individual fields 116. In further embodiments, the controller 118 can cause the photolithography system 100 to operate in a combination of the step mode and scanning mode.

After all the fields 116 on the microelectronic substrate 114 are exposed, the microelectronic substrate 114 can be removed from the substrate support 112 and undergo photoresist developing, baking, cleaning, and/or other suitable processing. Another microelectronic substrate 114 can then be loaded onto the substrate support 112 from the batch, and the foregoing exposure procedures can be repeated until at least some of the microelectronic substrates 114 in the batch are processed.

Moreover, other suitable fabrication processes may be carried out after the above-mentioned exposure and may include a rapid thermal annealing process, an ion implantation process, an etch process, a deposition process, but not limited thereto. During these fabrication processes, the shape and the topography of the microelectronic substrate 114 may be changed due to stresses accumulated in the microelectronic substrate 114 or in layers on the microelectronic substrate 114. For example, "wafer warpage" may occur during the fabrication processes. Because the alignment accuracy between two successive layers on the microelectronic substrate 114 is affected by the deformation of the microelectronic substrate 114, the changes in the shape and the topography of the microelectronic substrate 114 need to be carefully monitored so that an overlay error may be kept less than a certain range. In order to properly monitor the changes in the shape and topography of the microelectronic substrate 114 during the corresponding fabrication processes, at least two monitor or detection processes may be carried out respectively before and after each of the fabrication processes.

Figure 2:
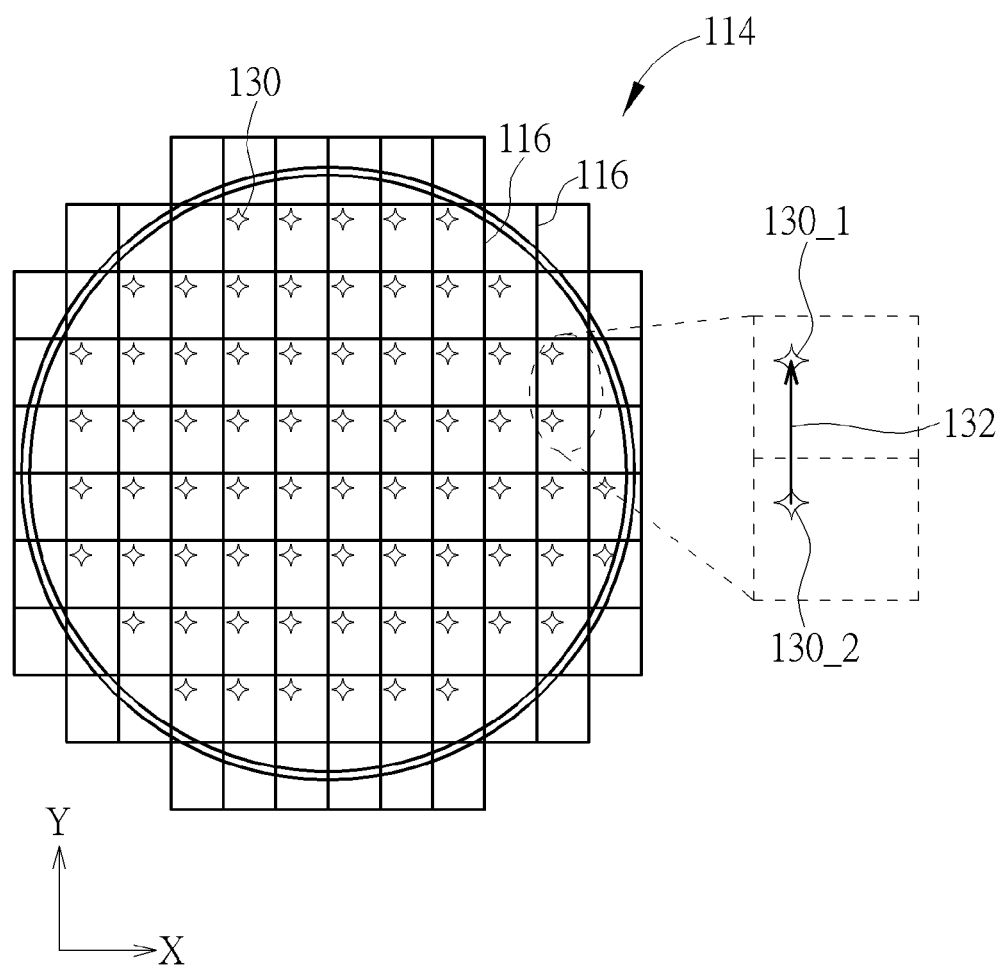
FIG. 2 is a schematic top view showing alignment marks on a microelectronic substrate in accordance with an embodiment of the present invention.
Figure 3:
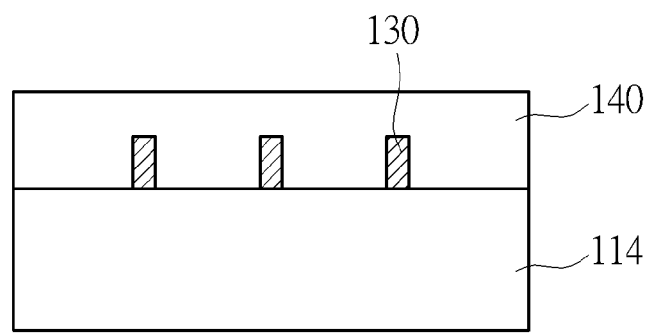
FIG. 3 is a cross-sectional diagram showing a microelectronic substrate with alignment marks in accordance with an embodiment of the present invention.

FIG. 2 is a schematic top view showing alignment marks on a microelectronic substrate according to one embodiment of the present invention. FIG. 3 is a cross-sectional diagram showing a microelectronic substrate with alignment marks according to one embodiment of the present invention. As shown in FIGS. 2 and 3, alignment marks 130 along an x-axis and a y-axis are disposed on the microelectronic substrate 114 or in a layer on the microelectronic substrate 114, and the position of the alignment marks 130 may be detected by a suitable detector independent from or integrated into the photolithography system 100 as depicted in FIG. 1. According to the present embodiment, the detector is integrated into the photolithography system 100, and the detection process is performed when the microelectronic substrate 114 is coated with a layer of photosensitive material such as photoresist 140. Specifically, the individual alignment marks 130 can include a trench, a grating, a circle, a square, and/or other suitable pattern on the microelectronic substrate 114. In the illustrated embodiment, the alignment marks 130 are respectively distributed on the microelectronic substrate 114 so that each of the fields 116 on the microelectronic substrate 114 may have one alignment mark 130.

When the detection process is completed, the measurement data about the position of the alignment marks 130 may be stored in the form of an electronic file. In this measurement data, vectors between two adjacent alignment marks 130 may also be determined based on the position of the alignment marks 130. For example, as shown in an enlarged figure on the right-hand side of FIG. 2, a vector 132 between two adjacent alignment marks 130_1 and 130_2 is determined when the position of the alignment marks 130 are detected by the detector. The individual vectors have a length representing a magnitude of the two adjacent alignment marks 130_1 and 130_2, and a direction representing an orientation of the adjacent alignment marks 130_1 and 130_2.

After the detection of the alignment marks 130, the layer of photoresist 140 may be exposed to a pattern of light. Then, unexposed photoresist 140 may be removed from the microelectronic substrate 114 by a chemical solution so as to form a patterned photoresist. Other photolithography process such as photoresist developing, baking, and/or cleaning may also be carried out. Afterwards, suitable fabrication processes such as an ion implantation process or an etch process may be carried out to implant dopants into layers underlying the patterned photoresist or to transfer the pattern of the patterned photoresist into the underlying layers. The patterned photoresist is then removed after these processes. Optionally, other suitable fabrication processes such as a deposition process or a rapid thermal process (RTP) may also be carried out after the removal of the patterned photoresist.

Figure 4:
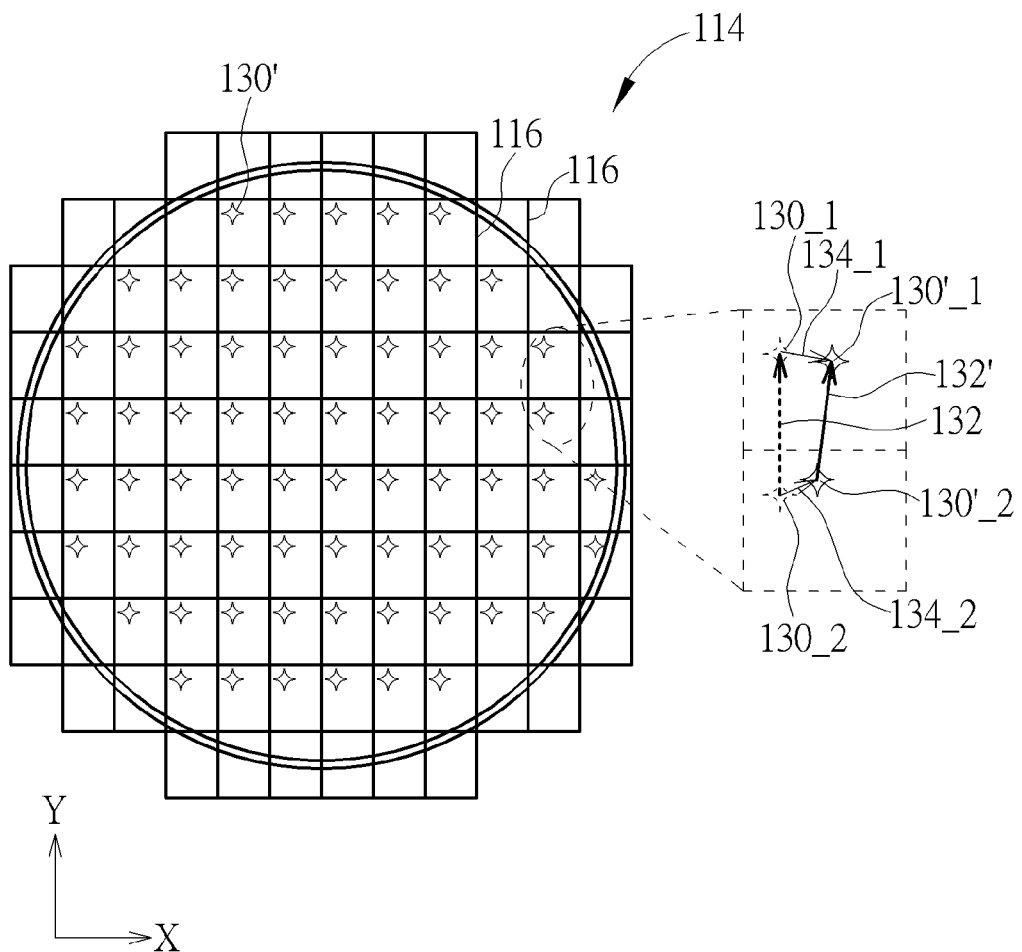
FIG. 4 is a schematic top view showing alignment marks on a microelectronic substrate in accordance with an embodiment of the present invention.
Figure 5:
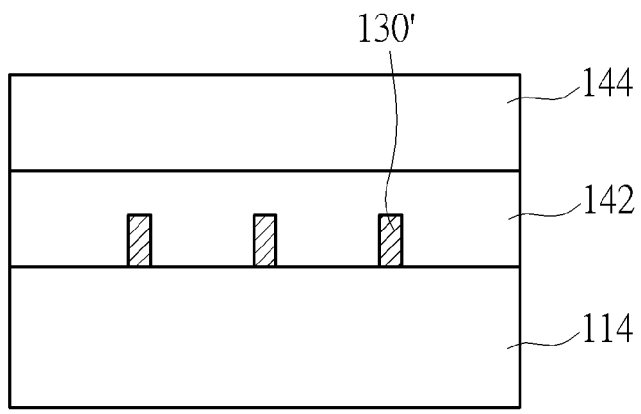
FIG. 5 is a cross-sectional diagram showing a microelectronic substrate with alignment marks in accordance with an embodiment of the present invention.

When the above-mentioned processes are completed, the microelectronic substrate 114 may be coated with another layer of photoresist and detected by the detector integrated in the photolithography system 100. FIG. 4 is a schematic top view showing alignment marks on a microelectronic substrate according to one embodiment of the present invention. FIG. 5 is a cross-sectional diagram showing a microelectronic substrate with alignment marks according to one embodiment of the present invention. As shown in FIGS. 4 and 5, the alignment marks 130' on the microelectronic substrate 114 are sequentially covered by a patterned or non-patterned layer 142 made of dielectric, metal or semiconductor and a photoresist 144.

When the detection process is completed, the measurement data about the position of the alignment marks 130' may be stored in the form of an electronic file. In this measurement data, vectors between two adjacent alignment marks 130' may also be determined based on the position of the alignment marks 130'. For example, a vector 132' between the alignment marks 130'_1 and 130'_2 as shown in an enlarged figure on the right-hand side of FIG. 4.

As shown in FIG. 4, the alignment marks 130' undergoing the above-mentioned fabrication processes may be slightly shifted from their original position due to the stress accumulated in the microelectronic substrate 114 or in the layer 142 on the microelectronic substrate 114. Specifically, the upper alignment mark 130'_1 is shifted from its original position (indicated by dashed lines) with an offset 134_1, while the lower alignment mark 130'_2 is shifted from its original position (indicated by dashed lines) with another offset 134_2. The offsets 134_1 and 134_2 are not predictable as they are influenced by each of the fabrication processes before the detection process.

Figure 6:
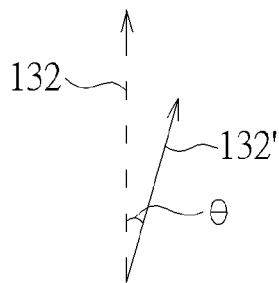
FIG. 6 is a schematic diagram showing a vector between two original alignment marks and a vector between two shifted alignment marks.

FIG. 6 is a schematic diagram showing a vector between two original alignment marks and a vector between two shifted alignment marks. Both an orientation and a length of the vector 132' between two shifted alignment marks 130' may differ from those of the vector 132 between two original alignment marks 130. Therefore, there is an angle θ between the vector 132 and the vector 132'.

It should be noted that, when the offset between the original alignment marks 130 and the shifted alignment marks 130' is higher than a certain degree, the alignment accuracy in the photolithography process may be lowered, which negatively impacts product yields of the photolithography process. Therefore, the measurement data of the detection processes respectively carried out before and after a stress-generating fabrication process, such as a rapid thermal anneal process, an ion implantation process, a deposition process or an etch process, are compared in accordance with one embodiment of the present invention. As shown in FIG. 4, if the offset or deviation of each of the alignment marks is greater than a predetermined value, the processing parameters of the stress-generating fabrication process or the detector may be checked automatically and/or manually. For example, in a case where the stress-generating fabrication process is a deposition process, the processing parameters such as deposition temperature, substrate temperature, background gas pressure, deposition rate and so forth may be checked in order to reduce the stress accumulating during the deposition process. In another case, if the vector 132 and the vector 132' have substantially the same length, but the angle θ between them is greater than a predetermined value, the reticle used in the subsequent photolithography process may be correspondingly rotated by certain degrees so as to properly transfer the pattern in the reticle onto the photoresist 144 on the microelectronic substrate 114.

Figure 7:
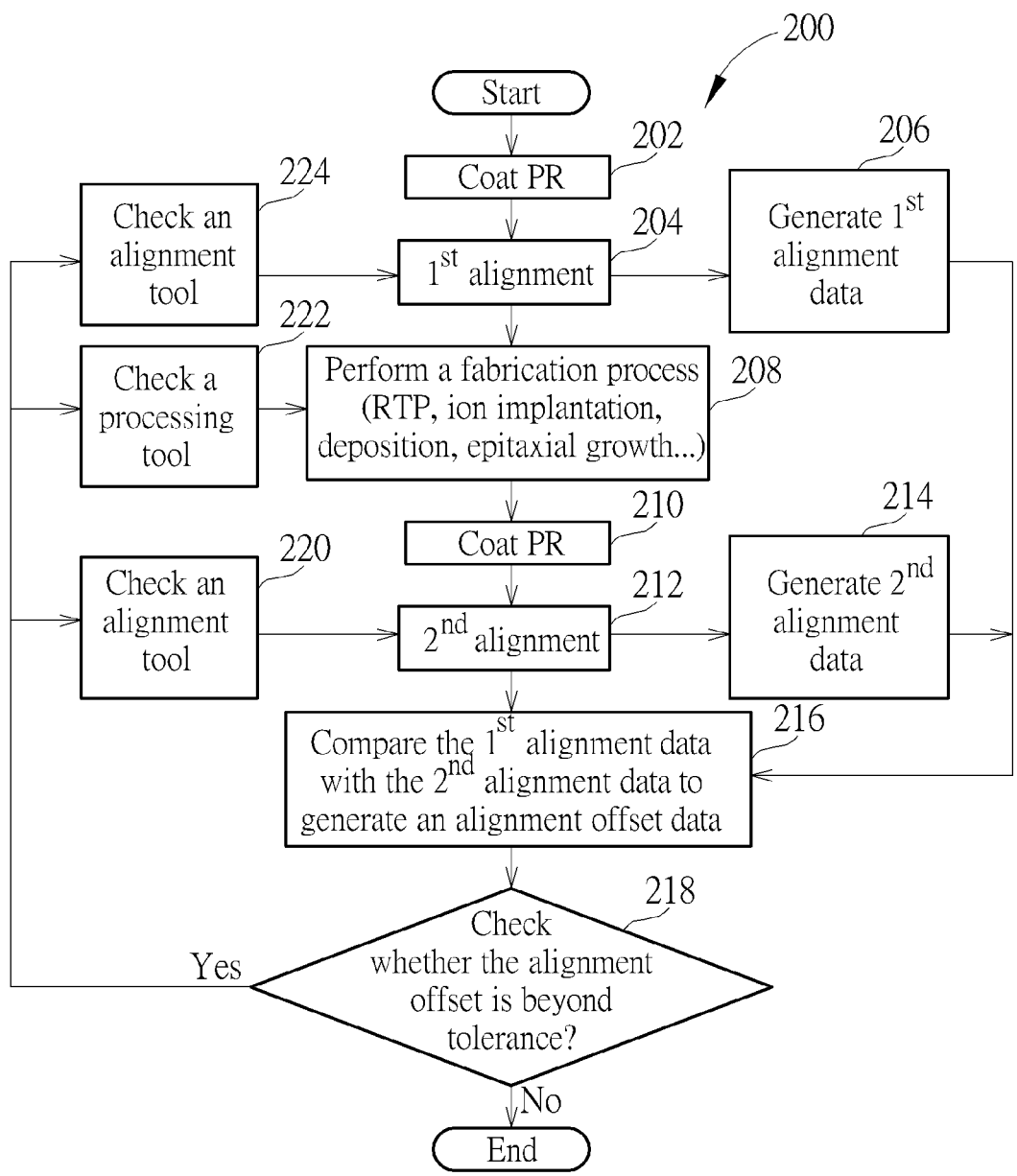
FIG. 7 is a flow chart showing a monitor method for process control in a semiconductor fabrication process in accordance with an embodiment of the present invention.

A flow chart is further illustrated in FIG. 7 in order to enable a person skilled in the relevant art to practice and understand the present invention. Please refer to FIG. 7 along with FIGS. 2-6. A monitor method for process control in a semiconductor fabrication process is disclosed. In step 202, the microelectronic substrate 114 coated with the photoresist layer 140 is provided. Then, in step 204, the alignment marks 130 on the microelectronic substrate 114 are measured through the alignment process to determine the position of each of the alignment marks 130. In step 206, the information about the position of each of the alignment marks 130 may be stored in a first alignment data. When the measurement is completed, a photolithography process may be carried out to transfer a pattern from a reticle to the photoresist layer 140. In step 208, a suitable fabrication process may then be performed during which stress may be generated and accumulated in the microelectronic substrate 114 or in layers on the microelectronic substrate 114. In steps 210 and 212, the microelectronic substrate 114 is coated with the photoresist layer 144 and another measurement is carried out to determine the position of each of the alignment marks 130'. Similarly, in step 214, the information about the position of each of the alignment marks 130' may be stored in a second alignment data. Then, in step 216, the first alignment data is compared with the second alignment data, and offset data about the offset between the original alignment marks 130 and the shifted alignment marks 130' may be generated. In step 218, the offset data is then calculated to check whether the offset between the original alignment marks 130 and the shifted alignment marks 130' is beyond a predetermined value or an acceptable tolerance. If no, the subsequent regular fabrication processes may be carried out. If yes, step 220, step 222, and/or step 224 may be performed to check the processing parameters in step 204, step 208, and/or step 212.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A monitor method for process control in a semiconductor fabrication process, comprising:
    forming a first alignment mark and a second alignment mark in a same layer in different die fields on a substrate before a fabrication process;
    measuring positions of the first alignment mark and the second alignment mark to determine a first vector between the first alignment mark and the second alignment mark and to generate a first measurement data;
    performing the fabrication process on the wafer after the step of generating a first measurement data;
    measuring positions of the first alignment mark and the second alignment mark to determine a second vector between the first alignment mark and the second alignment mark and generate a second measurement data after the step of performing the fabrication process;
    calculating offset values between the positions of the first alignment mark in the first measurement data and the position of the first alignment mark in the second measurement data and between the positions of the second alignment mark in the first measurement data and the position of the second alignment mark in the second measurement data; and
    comparing lengths of the first vector and the second vector and calculating an angle between the first vector and the second vector; and
    adjusting the fabrication process based on the offset values, the lengths of the first vector and the second vector and the angle between the first vector and the second vector when the offset values, the lengths and/or the angle are higher than predetermined values.

2. The method of claim 1, wherein the fabrication process is a rapid thermal annealing process, ion implantation process, deposition process or epitaxial growth process.

3. The method of claim 1, wherein the first alignment mark is covered by a film during the step of generating the second measurement data.

4. The method of claim 1, wherein the first measurement data and the second measurement data are generated by a measurement tool, and the fabrication process is performed by a processing tool.

5. The method of claim 4, further comprising checking the measurement tool and/or the processing tool when the offset values, the lengths, and/or the angle are greater than predetermined values.

6. The method of claim 1, further comprising generating an alarm message when the offset values, the lengths, and/or the angle are greater than predetermined values.

7. The method of claim 1, further comprising generating an offset value mapping based on the offset value.

8. The method of claim 1, further comprising:
    forming a photoresist layer on the first alignment mark before the step of generating the first measurement data;
    removing the photoresist layer; and forming another photoresist layer on the first alignment mark after the step of removing the photoresist layer.

* * * * *